(12) United States Patent
Yagishita et al.

(10) Patent No.: US 6,525,570 B2
(45) Date of Patent: Feb. 25, 2003

(54) INPUT/OUTPUT INTERFACING CIRCUIT, INPUT/OUTPUT INTERFACE, AND SEMICONDUCTOR DEVICE HAVING INPUT/OUTPUT INTERFACING CIRCUIT

(75) Inventors: Yoshimasa Yagishita; Toshiya Uchida, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 63 days.

(21) Appl. No.: 09/820,719

(22) Filed: Mar. 30, 2001

(65) Prior Publication Data

US 2002/0053926 A1 May 9, 2002

(30) Foreign Application Priority Data

Nov. 8, 2000 (JP) .......................................... 2000-340661

(51) Int. Cl.[7] .......................................... H03K 19/0175
(52) U.S. Cl. .............................. 326/86; 326/90; 326/82
(58) Field of Search .............................. 326/82, 83, 86, 326/90

(56) References Cited

U.S. PATENT DOCUMENTS 5,767,698 A * 6/1998 Emeigh et al. ................ 326/83
6,075,384 A * 6/2000 Sim et al. ..................... 326/86
6,332,661 B1 * 12/2001 Yamaguchi

* cited by examiner

Primary Examiner—Michael Tokar
Assistant Examiner—Anh Tran
(74) Attorney, Agent, or Firm—Arent Fox Kintner Plotkin & Kahn, PLLC

(57) ABSTRACT

The current generating unit in the transmitter generates output currents in accordance with a plurality of logic values. The reference current generating unit in the receiver generates a plurality of reference currents. The current comparing units in the receiver respectively compares reference currents with output current from the transmitter and restores the logic values. That is, the current is varied in correspondence with the logic values that are transmitted from the transmitter to the receiver, wherein the logic values are restored in the receiver according to a difference in the current value. Forming a plurality of current comparing units in the receiver makes it possible to easily compare the values of the output current from the transmitter and a plurality of reference currents. Therefore, the number of multi-valued bits can be easily increased so as to construct a high bit-rate multi-valued input/output interface.

11 Claims, 13 Drawing Sheets

INPUT/OUTPUT INTERFACING CIRCUIT, INPUT/OUTPUT INTERFACE, AND SEMICONDUCTOR DEVICE HAVING INPUT/OUTPUT INTERFACING CIRCUIT

BACKGROUND OF THE INVENTION

1. Field of the Invention

The present invention relates to an input/output interfacing circuit implemented in a semiconductor device, etc., and in particular it relates to an input/output interfacing circuit capable of inputting and outputting multiple values by a single signal line.

2. Description of the Related Art

Semiconductor devices such as a memory LSI, microprocessor, etc., are in the progress of high integration and high rate through the development of semiconductor manufacturing technology, wherein the data transfer rate has improved year by year.

In prior arts, in order to improve the data transfer rate, for example, in a memory LSI, a clock synchronizing type memory such as a synchronous DRAM, DDR SDRAM (Double Data Rate SDRAM), Rambus DRAM, etc., where an input/output circuit has improved operation speed has been developed. Also, the data transfer rate has been improved by increasing the number of bits of the input/output data to 16 or 32.

However, there is a limitation to heightening the operation speed of the input/output circuits. Also, an increase in the number of terminals increases the number of pads. Since the pad size depends on the packaging technology, it is difficult to shrink the size as semiconductor elements become finer. As a result, there is an undesirable possibility that the chip size is increased due to an increase in the number of pads. Hereafter, there is a possibility that the chip size is determined based on the number of pads. In a memory LSI, even if the number of address terminals is increased owing to the improvement of the integration level and an increase in the memory capacity, the chip size may be increased as described above.

As a way of improving the data transfer rate without an increase in the number of pads, that is, an increase in the chip size, a multiple value of data or addresses is taken into consideration.

FIG. 1 shows a multi-valued input/output circuit that the inventor has studied. The circuit shown in FIG. 1 is not publicly known.

In this type of multi-valued input/output circuit, a voltage generating unit 1 is formed in a semiconductor device at a transmitter that outputs data, and a plurality of voltage comparing units 2, a reference voltage generating unit 3 and a data restoring unit 4 are formed in a semiconductor device at a receiver that receives data.

The voltage generating unit 1 includes a data restoring unit 1a that decodes two-bit output data D1 and D0, a resistor part 1b that generates four types of voltages V4, V3, V2 and V1 by dividing resistance, and an output part 1c that outputs any one of the voltages V4 through V1 as an output voltage VOUT. The output part 1c is composed of a switch such as a CMOS transmission gate, etc. That is, the voltage generating unit 1 gives four types of output voltages VOUT to a semiconductor device at the receiver in response to the output data D1 and D0.

The respective voltage comparing units 2 compare the output voltages VOUT with the reference voltages VREF3.5, VREF2.5 and VREF1.5, respectively, accept the comparison results in synchronization with a clock signal CLK, and output the results as the input results RSL3, RSL2, and RSL1. The reference voltage generating unit 3 generates three types of reference voltages VREF3.5 through VREF1.5 by dividing the resistance. Herein, the reference voltage VREF3.5 is set between voltages V3 and V4, the reference voltage VREF2.5 is set between voltages V2 and V3, and the reference voltage VREF1.5 is set between voltages V1 and V2. That is, the figures at the end of these voltages show the relative values of voltages.

The data restoring units 4 receive the input results RSL3 through RSL1 and make any one of the input data IND3 through IND0 into a high level in accordance with the logic value of the output data D1 and D0.

FIG. 2 shows the detail of the voltage comparing unit 2.

The voltage comparing unit 2 includes a differential amplifier 5, a latching circuit 6, and an output circuit 7. The differential amplifier 5 has a current mirror circuit and changes the output node to a high level or low level in accordance with the output voltage VOUT and reference voltages VREF3.5 (or VREF2.5, VREF1.5). The latching circuit 6 accepts an output from the differential amplifier 5 in synchronization with a rise edge of a clock signal CLK. The output circuit 7 outputs data, which are latched by the latching circuit 6, as the input results RSL3 (or RSL2, RSL1).

FIG. 3 shows the detail of the data restoring unit 4.

In the data restoring unit 4, inverted logic of the input result RSL3 is outputted as input data IND3, inverted logic of the input result RSL2 is outputted as input data IND2 when the input result RSL3 is at a high level, and inverted logic of the input result RSL1 is outputted as input data IND1 when the input result RSL2 is at a high level, and the logic, which is the same as the input result RSL1, is outputted as input data IND0. As a result, for example, when both output data D1 and D0 are at a high level ("3" in the binary code), only the input data IND3 is made into a high level, and when the output data D1 and D0 are in a low level and high level ("1" in the binary code), respectively, only the input data IND1 is made into a high level.

As shown above, in the transmitter, any one of the voltages V4 through V1 divided in response to the output data D1 and D0 is selected and outputted as an output voltage VOUT. In the receiver, by obtaining the logic value corresponding to the output voltage VOUT, a multiple value (in this case, 2 bits) are transmitted and received.

However, the voltage generator unit 1 of the transmitter selects any one of a plurality of voltages V4 through V1, which are obtained by dividing the resistance, by a switch such as a CMOS transmission gate, etc., in response to the output data D1 and D0. The difference in voltage corresponding to the logic value is small because the voltages are generated by dividing the resistance. Therefore, it was difficult to change the output voltage VOUT to a high rate when switching the CMOS transmission gate, etc. Since the difference in voltage corresponding to the logic value is small, only two-bit of data could be made into a multiple value.

In addition, the voltage range in which the differential amplifier 5 effectively operates is predetermined in the receiver, which makes it difficult to actuate the differential amplifier 5 in all the ranges of the output voltages VOUT. As a result, the differential amplifiers 5 of the voltage comparing units 2 shown in FIG. 2 have to be designed so as to optimally operate in correspondence with the received output voltage VOUT, respectively.

SUMMARY OF THE INVENTION

It is therefore an object of the invention to provide an input/output interfacing circuit capable of inputting and outputting multiple value data at high speed by a simplified circuit, and a semiconductor device having the input/output interfacing circuit.

According to one of the aspects of the input/output interfacing circuit of the invention, the input/output interfacing circuit includes a current generating unit in the transmitter, and a reference current generating unit, a plurality of current comparing units, and a data restoring unit in the receiver. The current generating unit generates output currents respectively corresponding to each of logic values. The reference current generating unit generates a plurality of reference currents. The current comparing units respectively compare the reference currents with the output current from the transmitter. The data restoring unit restores the logic values in the receiver according to the comparison results from the current comparing units. That is, the current is varied in accordance with each of logic values (for example, data, address, etc.) that are transmitted from the transmitter to the receiver, and the logic value is restored in the receiver according to differences in the current values. In other words, changing values of the currents which flow in a signal line, enables transmission of multiple value information from the transmitter to the receiver.

By forming a plurality of current comparing units in the receiver, it is possible to easily, respectively compare the level of the output current from the transmitter with the levels of a plurality of reference currents. Further, it becomes possible to widen the operation range of the current comparing unit in comparison with prior art voltage comparing circuits. This eliminates necessity for fine adjustment of the current comparing unit in accordance with a value of an output current from the transmitter. That is, the design data of a plurality of current comparing units can be made the same.

It is possible to construct a high bit-rate multi-valued input/output interface by converting the logic value to the current value in the transmitter and restoring the logic value by comparing the intensity of the current in the receiver, compared with prior arts in which the voltage has been divided. In addition, in comparison with the prior arts in which the voltage has been divided, it is possible to easily increase the number of bits with a multiple value. As a result, the data transfer rate can be improved.

When the transmitter and the receiver are formed in separate devices, the number of input/output terminals (the number of pads) of devices can be decreased. The decrease in pad number results in reducing the chip size of both devices. In case where the transmitter and the receiver are formed in the same device, the number of signal line patterns that transmit logic values can be reduced. A reduction in layout size of the signal line patterns enables a reduction in chip size.

According to another aspect of the input/output interfacing circuit of the invention, the number of current comparing units and the number of reference currents generated by the reference current generating unit are set one smaller than the number the logic value could possibly be. Each of the reference current values is respectively set between the output current values adjacent thereto. Therefore, the number of the current comparing units can be minimized.

According to still another aspect of the input/output interfacing circuit of the invention, the transmitter and the receiver are respectively formed in separate devices. The input/output interfacing circuit includes a standard current generating unit in the transmitter, and a dummy current generating unit and a correcting circuit in the receiver. The standard current generating unit uses an element, which is identical to or equivalent to the element used in the current generating unit, and generates the standard current at the output. For example, the standard current generating unit generates the standard current at the output, which has the same value as the output current generated by the current generating unit corresponding to a logic value. The dummy current generating unit is constructed identically to or equivalently to the standard current generating unit, and generates standard current at the input. The correcting circuit controls the reference current generating unit to correct the reference current according to a difference between the standard current at the output and the standard current at the input.

The output current and the reference current that are compared by the current comparing unit are expected to intrinsically have a predetermined correlation. However, where the transmitter and receiver are formed in separate devices, the relationship between the output current and the reference current may change due to differences in power supply voltage, operating temperature, or production conditions of the respective devices. Since the standard current generating unit and the dummy current generating unit are formed identically to or equivalently to each other, the change creates a difference between the standard current at the output and the standard current at the input. Therefore, since the reference current is corrected according to the difference, it is possible to restore the logic value in the receiver with reliability.

According to further another aspect of the input/output interfacing circuit of the invention, the transmitter and the receiver are formed in separate devices. The input/output interfacing circuit includes, in the receiver, a current source that supplies a current to the current generating unit in the transmitter, and a current source that supplies a current to the reference current generating unit in the receiver. Therefore, the current supply capacities of both the current sources become identical to each other. As a result, the correlation between the output current and the reference current can be maintained with high accuracy.

According to yet another aspect of the input/output interfacing circuit of the invention, the current generating unit includes a plurality of transistors with drivability in different stages of strength. Each bit of the logic values, which are expressed in binary number is respectively supplied to the inputs of transistors. The output current is generated according to a value of current which flows in the transistors that are turned on in accordance with the logic values. Therefore, the logic values consisting of a plurality of bits can be easily converted to an output current.

According to yet another aspect of the input/output interfacing circuit of the invention, the current comparing unit compares the output current with the reference current in synchronization with a timing signal used in the transmitter. That is, the output current and reference current can be compared with each other with accuracy at a predetermined timing synchronized with the transmitter.

According to one of the aspects of the input/output interface of the invention, a transmitting device includes a current generating unit and a standard current generating unit, and the receiving device includes a reference current generating unit, a current comparing unit, a dummy current generating unit, and a correcting circuit. The current generating unit generates an output current corresponding to the logic value. The standard current generating unit generates the standard current at the output by using an element that is identical to or equivalent to the element used for the current generating unit. For example, the standard current generating unit generates standard current at the output having the same value as the output current that is generated by the current generating unit, corresponding to a logic value. The reference current generating unit generates reference currents. The current comparing unit respectively compares values of the reference currents and the output current. The dummy current generating unit is constructed identically to or equivalently to the standard current generating unit, and generates standard current at the input. The correcting circuit controls the reference current generating unit on the basis of a difference between the standard current at the output and the standard current at the input, thereby correcting the reference current values.

The output current and the reference current that are compared by the current comparing unit are expected to intrinsically have a predetermined correlation. However, where the transmitter and the receiver are formed in separate devices, the relationship between the output current and the reference current may change due to differences in power supply voltage, operating temperature, or production conditions of the respective devices. Since the standard current generating unit and the dummy current generating unit are formed identically to or equivalently to each other, the change leads to creating a difference between the standard current at the output and the standard current at the input. Therefore, since the reference current is corrected according to the difference, it is possible to reliably compare a value of the reference current and the output current.

According to one of the aspects of a semiconductor device having the input/output interfacing circuit of the invention, the input/output interfacing circuit includes a reference current generating unit, a plurality of current comparing units, and a data restoring unit. The reference current generating unit generates a plurality of reference currents. The current comparing units respectively compare the reference currents with the output currents in accordance with the logic value supplied from the exterior. In addition, the data restoring unit restores the logic value sent from the transmitter in the receiver according to the comparison results from the current comparing units. That is, the current is varied in accordance with the logic values (for example, data, address, etc.) that are transmitted from the transmitter to the receiver, the logic value is restored in the receiver according to a difference in the current values. In other words, changing values of the currents which flow in a signal line, enables transmission of multiple value information from the transmitter to the receiver.

Since a plurality of current comparing units are formed in the receiver, it is possible to easily compare values of the output current from the transmitter and a plurality of reference currents. It is also possible to further widen the operating range of the current comparing units, compared with a prior art voltage comparing unit. As a result, it is not necessary to fine adjust the current comparing units in accordance with the values of the output current from the transmitter. That is, the design data of a plurality of current comparing units can be made identical to each other.

For example, receiving multiple value data in correspondence with a current value from one input terminal allows a reduction in the number of input terminals (number of pads) of a semiconductor device. Accordingly, the reduction in pad number enables a reduction in the chip size of the devices.

According to another aspect of the semiconductor device having the input/output interfacing circuit of the invention, the input/output interfacing circuit includes a current generating unit having a plurality of transistors with drivability in different stages of strength. Each bit of the logic values, which are expressed in binary number, is supplied to the inputs of the transistors. The input/output interfacing circuit generates an output current, which is inputted to and outputted from the exterior, according to a value of current which flows in the transistors that are turned on in accordance with the logic values. Therefore, the logic values consisting of a plurality of bits can be easily converted to an output current and can be inputted to or outputted from the exterior.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Hereinafter, embodiments of the invention will be explained in detail with reference to the accompanying drawings.

Figure 1:
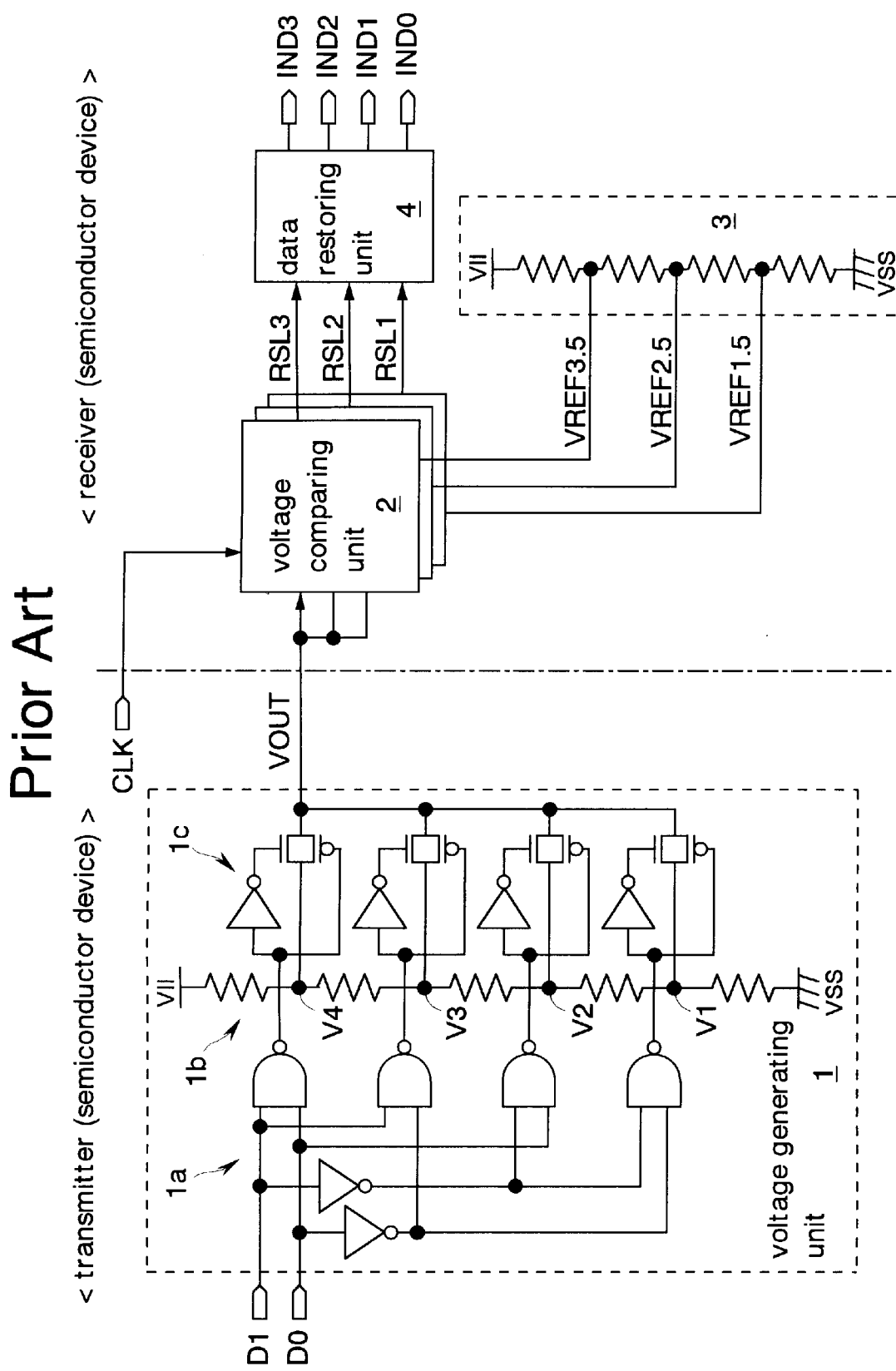
FIG. 1 is a block diagram showing a prior art multi-valued input/output interfacing circuit.
Figure 2:
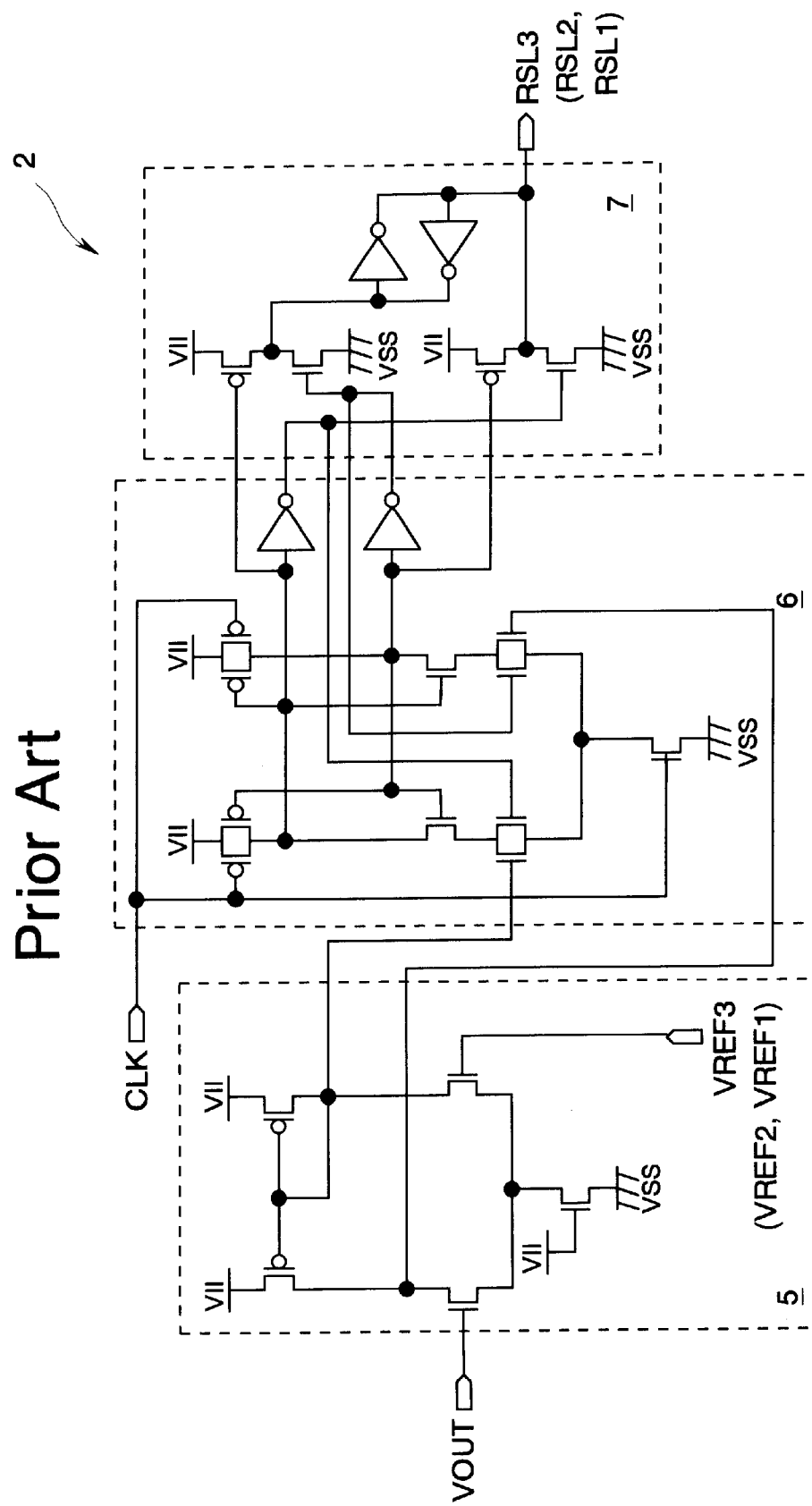
FIG. 2 is a circuit diagram showing the voltage comparing unit of FIG. 1.
Figure 3:
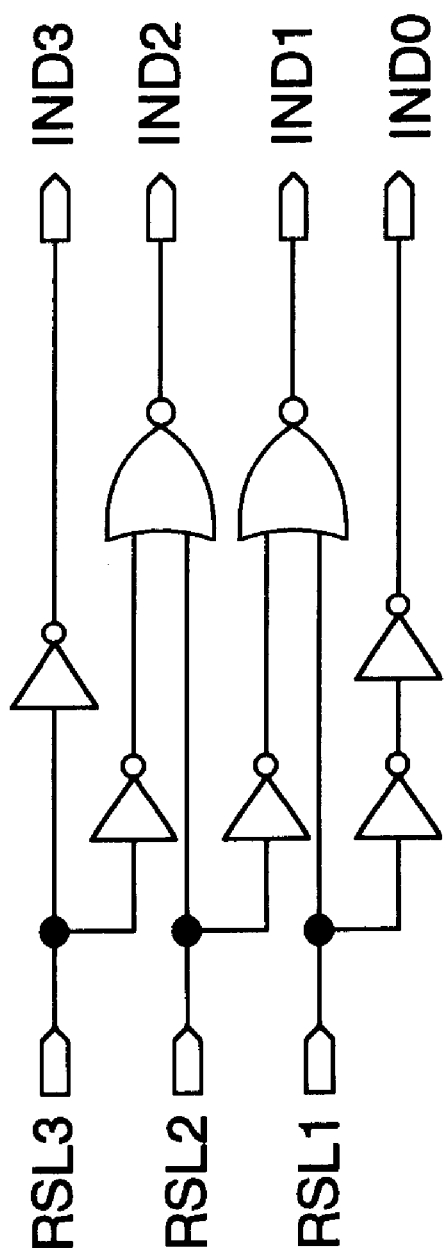
FIG. 3 is a circuit diagram showing the data restoring unit of FIG. 1.
Figure 4:
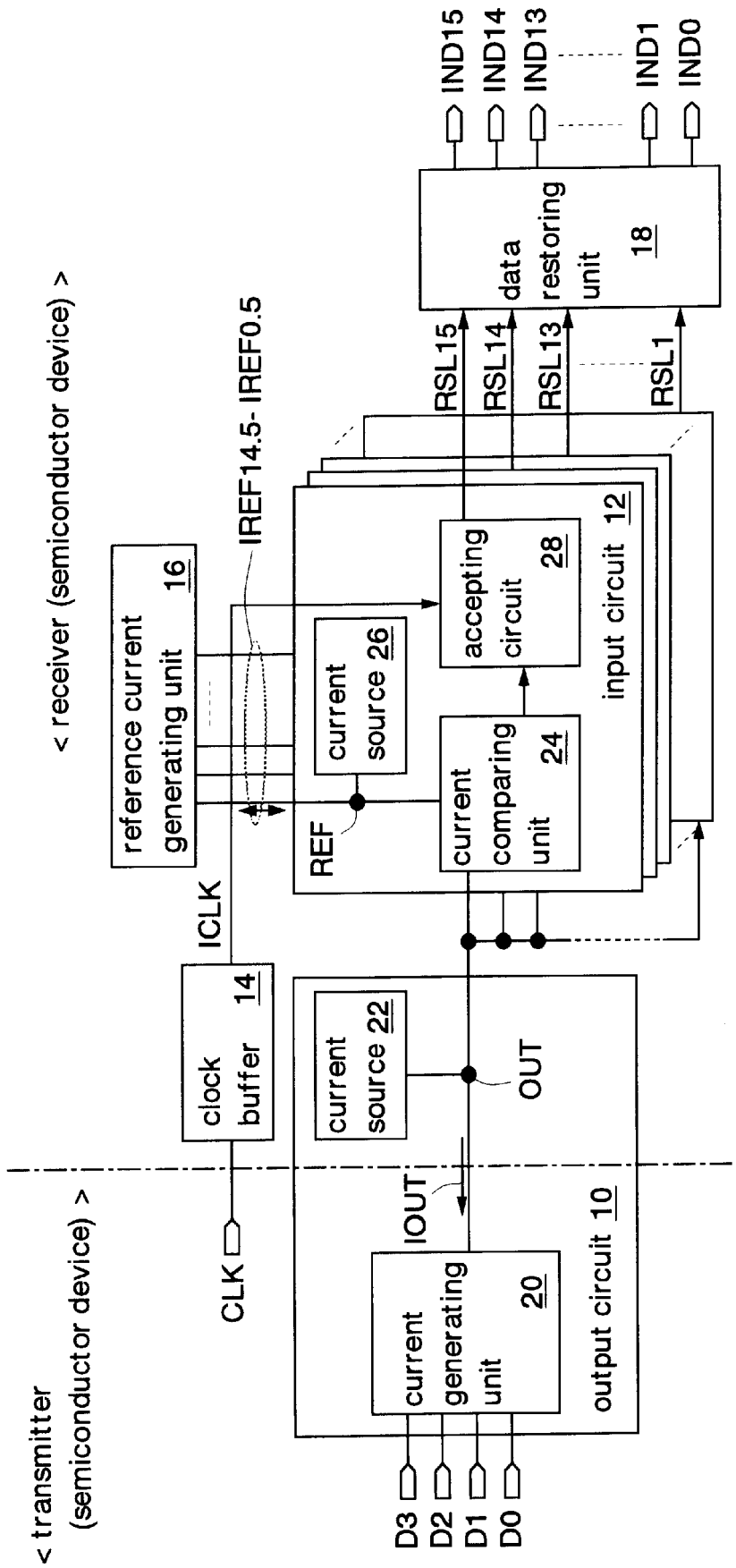
FIG. 4 is a block diagram showing the first embodiment of the invention.

FIG. 4 shows the first embodiment of an input/output interfacing circuit and a semiconductor device having the input/output interfacing circuit according to the invention.

In the embodiment, a part of an output circuit 10 is formed in a semiconductor device (transmitting device) that becomes a transmitter, and another part of the output circuit 10, fifteen input circuits 12, a clock buffer 14, a reference current generating unit 16 and a data restoring unit 18 are formed in a semiconductor device (receiving device) that becomes a receiver. The respective semiconductor devices are formed on a silicon substrate by using the CMOS process.

The output circuit 10 includes a current generating unit 20 that generates sixteen types of output currents IOUT at the output node OUT in response to four bits of output data D3, D2, D1 and D0, and a current source 22 that provides a current to the output node OUT. The current source 22 is formed in a semiconductor device of the receiver. The output current IOUT being of currents supplied from the current source 22, flows into the output circuit 10 in correspondence with the output data D3 through D0.

The input circuits 12, respectively, include a current comparing unit 24, a current source 26, and an accepting circuit 28. The current comparing unit 24 compares a reference current IREF14.5(or IREF13.5 through IREF0.5), which is generated by the reference current generating unit 16 described later, with the output current IOUT, and outputs the comparison result to the accepting circuit 28. The accepting circuit 28 accepts the comparison result in synchronization with an internal clock signal ICLK (timing signal), and outputs the accepted information as the input results RSL15 through RSL1. In other words, the output current and the reference current are compared in synchronization with the internal clock signal ICLK. Herein, the internal clock signal ICLK is a signal that a clock signal CLK used for the semiconductor device of the transmitter is received by the clock buffer 14.

The reference current generating unit 16 gives fifteen types of reference currents IREF14.5 through IREF0.5 to connection nodes REF with the current comparing unit 24 in the respective input circuits 12. The number of reference currents IREF14.5 through IREF0.5 is made one smaller than the number of types of the output currents IOUT.

The data restoring unit 18 restores a logic value of the output data D3 through D0 by making any one of the input data IND15 through IND0 into a high level upon receiving the input results RSL15 through RSL1.

Figure 5:
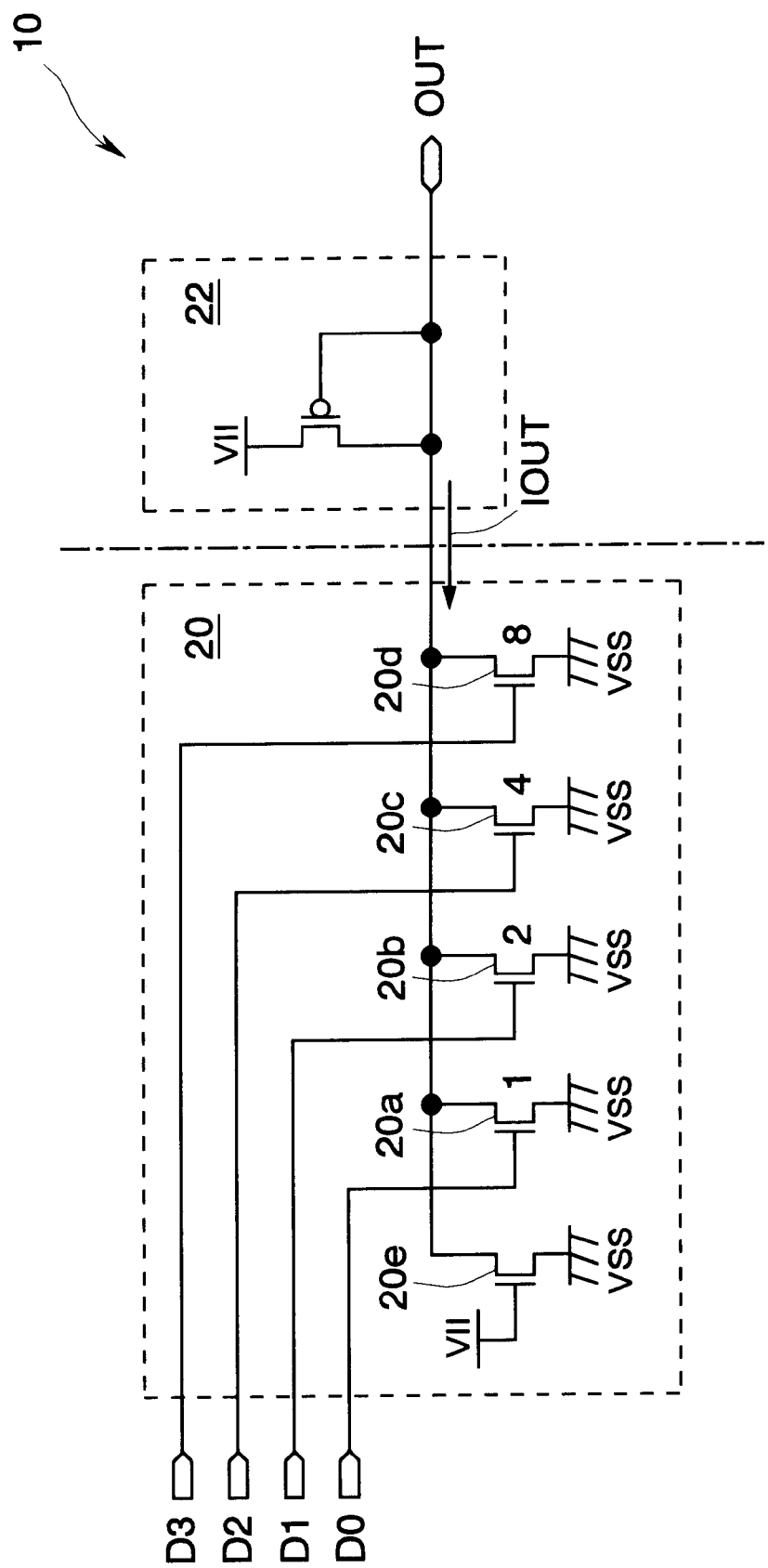
FIG. 5 is a circuit diagram showing the detail of the output circuit of FIG. 4.

FIG. 5 shows the detail of the output circuit 10.

The current generating unit 20 of the output circuit 10 includes nMOS transistors 20a, 20b, 20c and 20d whose gate widths have a ratio of 1:2:4:8, and an nMOS transistor 20e having a power supply line VII connected to its gate. Hereinafter, an nMOS transistor and a pMOS transistor are merely called as "nMOS" and "pMOS". In the drawing, a figure adjacent to the nMOSs shows the ratio of the gate width. The nMOS transistor 20e is used as a high-resistance resistor, and prevents the node OUT from floating.

The nMOSs 20a, 20b, 20c and 20d are formed so as to make the channel lengths thereof the same. For this reason, the current drivability of the nMOSs 20a, 20b, 20c and 20d is increased two times by two times in proportion to the gate width. Output data D3 through D0 are, respectively, provided into the gates of the nMOSs 20a, 20b, 20c and 20d. That is, since the gate widths of the nMOSs 20a, 20b, 20c and 20d are set with respect to the weighting of the output data D3 through D0, the output current IOUT that is generated in the output circuit 10 has sixteen types corresponding to the binary number of output data D3 through D0.

The current source 22 of the output circuit 10 includes a pMOS whose source is connected to the power supply line VII and whose gate and drain are connected to the node OUT.

Figure 6:
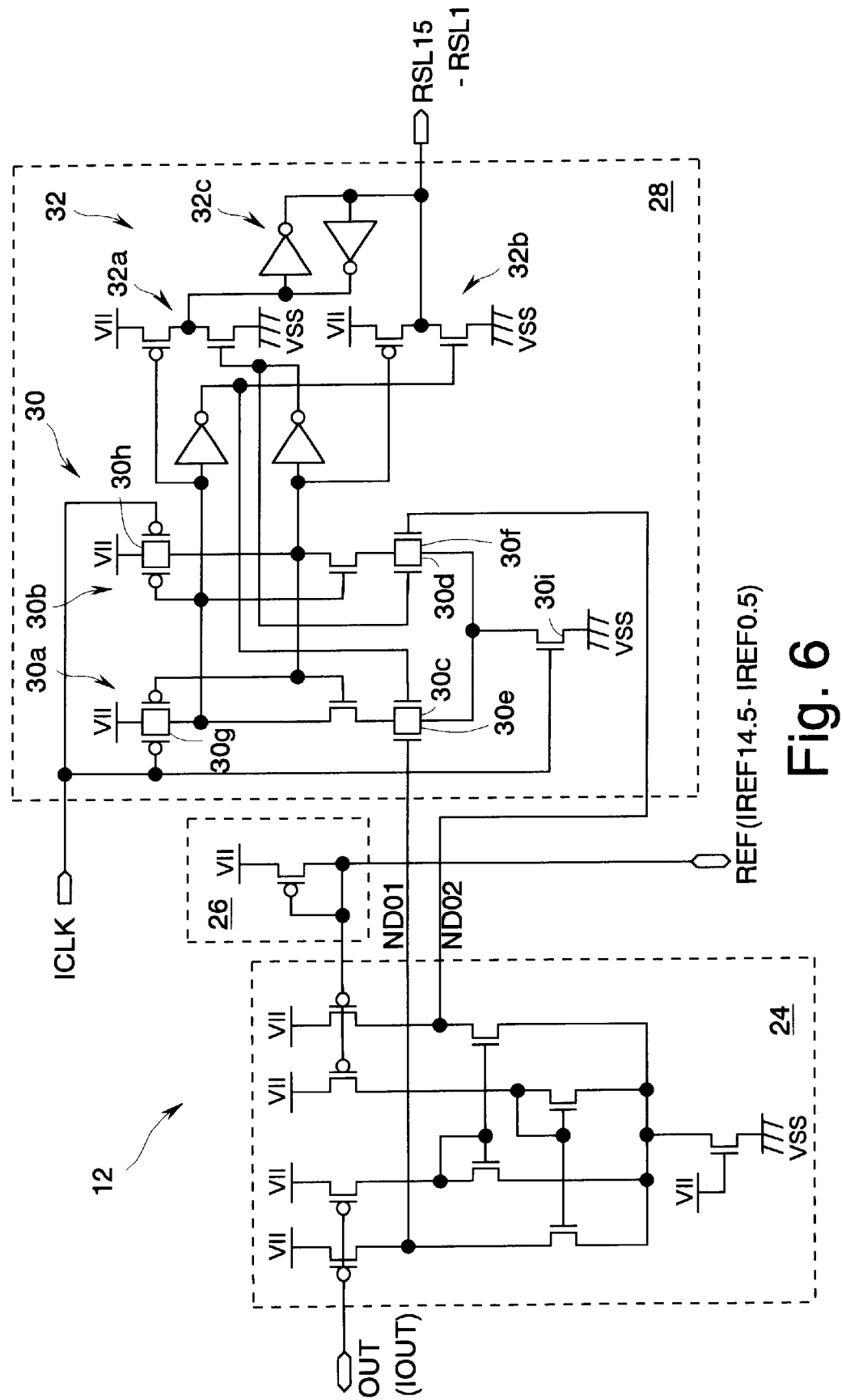
FIG. 6 is a circuit diagram showing the detail of the input circuit of FIG. 4.

FIG. 6 shows the detail of the input circuit 12.

The current comparing unit 24 of the input circuit 12 is composed of a combination of two differential amplifiers. The respective differential amplifiers include a current mirror part composed of nMOS, and a differential input part composed of pMOS. The gate of one pMOS of the differential input part is connected to the node OUT, and the gate of the other pMOS is connected to the node REF, into or from which the reference current IREF14.5(or IREF13.5 through IREF0.5) is inputted or outputted. That is, a voltage in accordance with the output current IOUT and reference current IREF14.5 through IREF0.5 is respectively applied to the gates of pMOSs.

Where the output current IOUT is larger than the reference current IREF14.5(or IREF13.5 through IREF0.5), the voltage between the gate and source of the pMOS connected to the node OUT is made lower than the voltage between the gate and source of the pMOS connected to the node REF. Therefore, the output nodes ND01 and ND02 of the current comparing unit 24, respectively, are made into a high level and a low level.

The current source 26 of the input circuit 12 includes a pMOS whose source is connected to the power supply line VII and whose gate and drain are connected to the node REF. Since the pMOS of the current source 26 shown in FIG. 5 is constructed so as to have the same size as that of the pMOS of the current source 22 shown therein, they have the same current supply capacity. By forming both the current sources 22 and 26 in the semiconductor device of the receiver, the current supply capacity of the current sources 22 and 26 can be made the same regardless of fluctuation in production conditions.

The accepting circuit 28 of the input circuit 12 is composed of a latch part 30 and an output part 32. The latch part 30 includes CMOS inverters 30a and 30b that constitutes a latch, to which an input and an output are alternately connected, a feedback nMOS 30c that receives inverted logic of the output of the CMOS inverter 30a by the gate, a feedback nMOS 30d that receives inverted logic of the output of the CMOS inverter 30b by the gate, nMOS 30e and 30f whose gates are, respectively, connected to the node ND01 and ND02, pMOS 30g and 30h that, where the internal clock signal ICLK being a timing signal is at a low level, make the outputs of the CMOS inverters 30a and 30b into a high level, and inactivates the latch, and an nMOS 30i that, where the internal clock signal ICLK is at a high level, connects the latch part 30 to the power supply (ground line VSS), and activates the latch part 30.

The latch part 30 accepts the comparison results by the current comparing unit 24, which is expressed in terms of a potential difference between the nodes ND01 and ND02, in synchronization with a rise edge of the internal clock signal ICLK, and outputs the accepted information to the output part 32.

The output part 32 includes output buffers 32a and 32b each outputting logic opposed to each other in response to the output of the latch part 30, and a latch 32c that latches the output of the output buffers 32a and 32b. The output buffer 32a is composed of a pMOS that receives an output of the CMOS inverter 30a by the gate, and an nMOS that receives inverted logic of the output of the CMOS inverter 30b by the gate. The output buffer 32b is composed of a pMOS that receives an output of the CMOS inverter 30b by the gate, and an nMOS that receives inverted logic of the output of the CMOS inverter 30a by the gate. And, the input result RSL15 (or RSL14 through RSL1) is outputted from the output buffer 32b.

Figure 7:
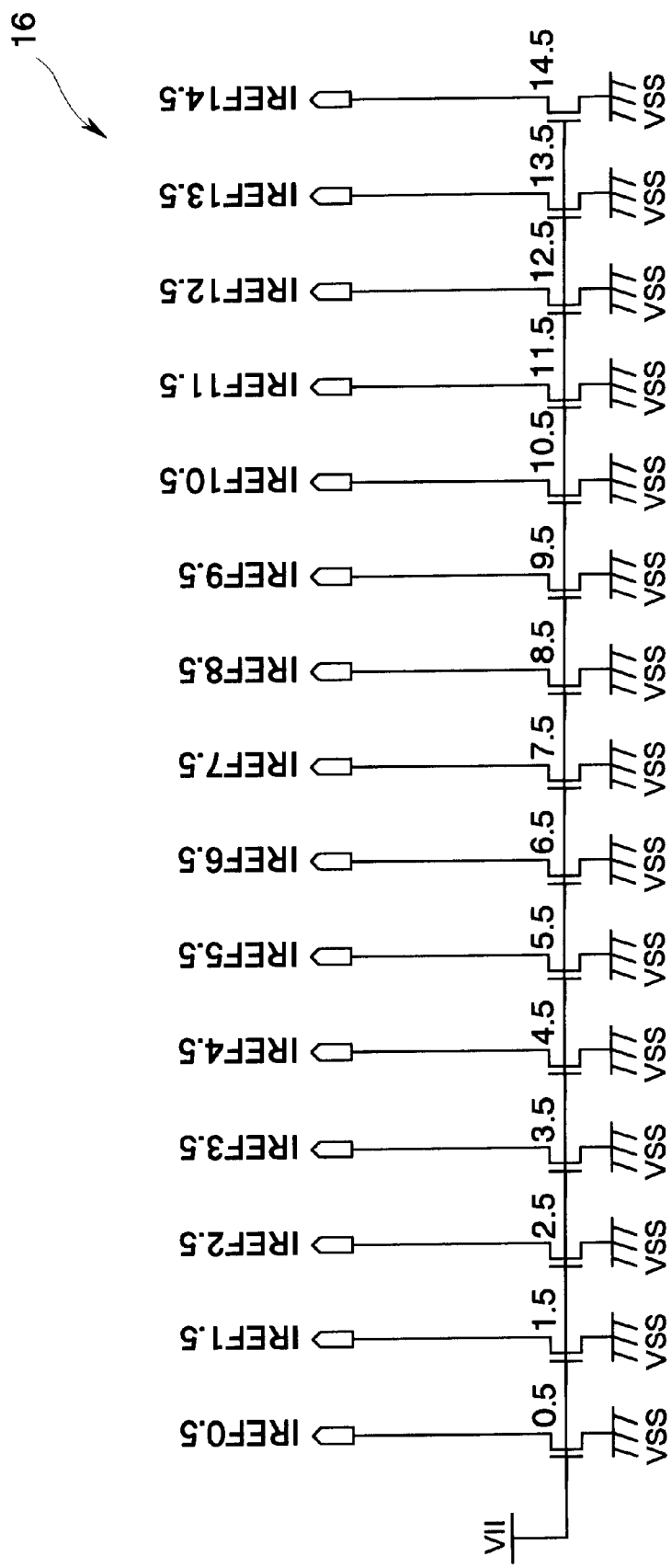
FIG. 7 is a circuit diagram showing the detail of the reference current generating unit of FIG. 4.

FIG. 7 shows the detail of the reference current generating unit 16.

The reference current generating unit 16 includes fifteen nMOSs having the power supply line VII connected to the gate. The nMOS is formed so that the relative value of the gate width has a 1.0 step between 0.5 and 14.5. The nMOSs cause the reference currents IREF14.5 through IREF0.5 corresponding to the respective gate widths to flow into the ground line VSS, respectively. In the drawing, the figures shown adjacent to the nMOSs show the ratio of the gate widths. These figures correspond to the figures shown in the output circuit 10 in FIG. 5. The channel lengths of the nMOSs of the reference current generating unit 16 are made identical to the channel lengths of the nMOSs 20a through 20d of the output circuit 10. Since the current sources 22 and 26 have the same capacity, the relative value of the drivability of the nMOSs of the reference current generating unit 16 and the nMOSs 20a through 20d of the output circuit 10 is expressed in terms of figures written adjacent to the nMOSs.

Figure 8:
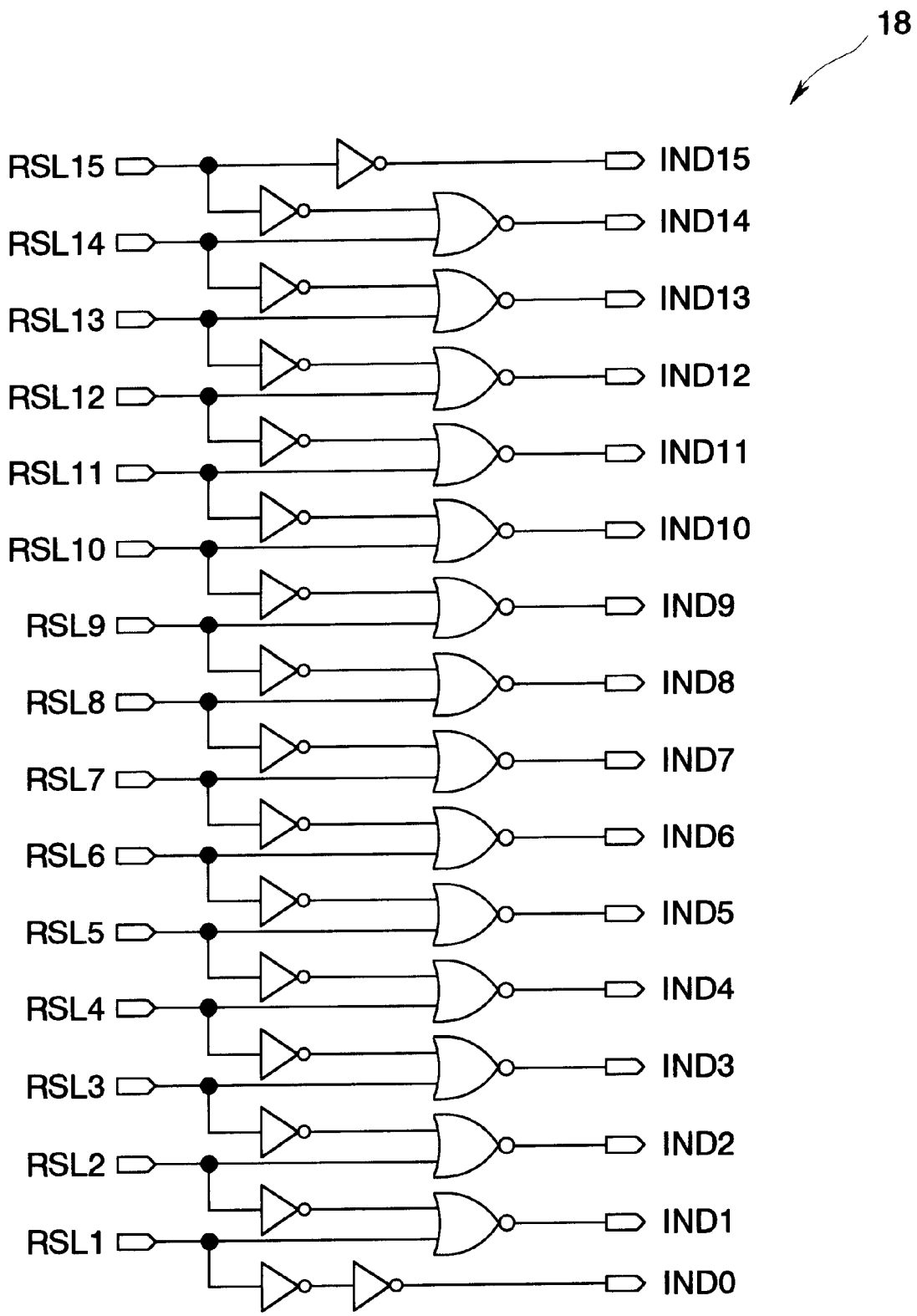
FIG. 8 is a circuit diagram showing the detail of the data restoring unit of FIG. 4.

FIG. 8 shows the detail of a data restoring unit 18.

The data restoring unit 18 is composed of a plurality of inverters and NOR gates. In the data restoring unit 18, the inverted logic of the input result RSL15 is outputted as input data IND15, the inverted logic of the input result RSL14 is outputted as input data IND14 where the input result RSL15 is at a high level, the inverted logic of the input result RSL13 is outputted as input data IND13 where the input result RSL14 is at a high level, the inverted logic is thus outputted, and finally, the inverted logic of the input result RSL1 is outputted as input data IND1 where the input result RSL2 is at a high level, and the same logic as the input result RSL1 is outputted as input data IND0. Resultantly, for example, where all the output data D3 through D0 are at a high level ("15" in the binary data), only the input data IND15 is made into a high level, and where the output data D3, D2, D1 and D0 are at a low level, high level, low level and high level, respectively, ("5" in the binary data), only the input data IND5 is made into a high level.

In the input/output interfacing circuit described above, the logic value (multiple value) of the transmitter is transmitted to the receiver via one signal line (note OUT) as described above, and is restored.

First, in the transmitter, an output current IOUT in accordance with the logic value is generated, wherein the node OUT connected to one differential input terminal in the current comparing unit 24 of the receiver is made into a predetermined voltage. In order to control the current flowing in the node OUT in response to the output data D3 through D0, the node OUT is made into a predetermined voltage at a high rate. On the other hand, the node REF connected to the other differential input terminal in fifteen current comparing units 24 quickly turns to a predetermined voltage in response to the reference currents IREF14.5 through IREF0.5. The voltage of the node OUT is compared with the voltage of the node REF, and the comparison results are outputted as the input results RSL15 through RSL1. Then, multiple value data transmitted from the transmitter in response to the input results RSL15 through RSL1 are restored as any one of the sixteen types of input data IND15 through IND0. That is, the multiple value data that are transmitted from the transmitter are restored by respectively comparing the output current IOUT generated in the transmitter with the reference currents IREF14.5 through IREF0.5 generated in the receiver.

As described above, in the input/output interfacing circuit and semiconductor device having the input/output interfacing circuit according to the embodiment, the output current IOUT from the transmitter is compared with the reference currents IREF14.5 through IREF0.5, respectively, by a plurality of the current comparing units 24, which are formed in the semiconductor device that is the receiver, wherein the logic value can be restored in the receiver on the basis of the comparison results. That is, changing values of the current flowing in the signal line of the node OUT enables transmission of multiple value information from the transmitter to the receiver.

Since a plurality of the current comparing units 24 are formed in the receiver, it is possible to easily compare the values of the output current IOUT from the transmitter and a plurality of the reference currents IREF14.5 through IREF0.5. Since the range of the output current IOUT can be set in accordance with the range of operation of the current comparing units 24, it is not necessary to fine adjust the respective current comparing units 24 in accordance with the value of the output current IOUT from the transmitter. As a result, the design data such as layout data, etc., of the input circuit 12 can be commonly used.

Since the logic values D3 through D0 are converted to the current value IOUT by the transmitter, and the level of the current IOUT is compared with the voltage value of the node OUT by the receiver to restore the logic value, it is possible to construct a high rate multi-valued input/output interfacing circuit. Also, compared with the prior art in which a voltage is divided, it is possible to easily increase the number of multi-valued bits. Therefore, it is possible to improve the data transfer rate. This enables a construction of the input/output interface where multiple value data can be input/output by a simple circuit.

Since multiple value information can be transmitted via one signal line (node OUT), the number of input/output terminals (number of pads) of the semiconductor device can be reduced. Since the number of pads is reduced, it is possible to reduce the chip size of both the semiconductor devices (transmitter and receiver).

In the semiconductor device of the transmitter, a plurality of nMOSs 20a through 20d whose drivability is increased one after another are formed in the current generating unit 20 of the output circuit 10, respective bits (D3 through D0) of a logic value, which is expressed in binary number, are provided to the inputs of the nMOSs 20a through 20d. Therefore, the logic value consisting of a plurality of bits is easily converted to the output current IOUT, wherein the logic value can be inputted to and outputted from the exterior.

Figure 9:
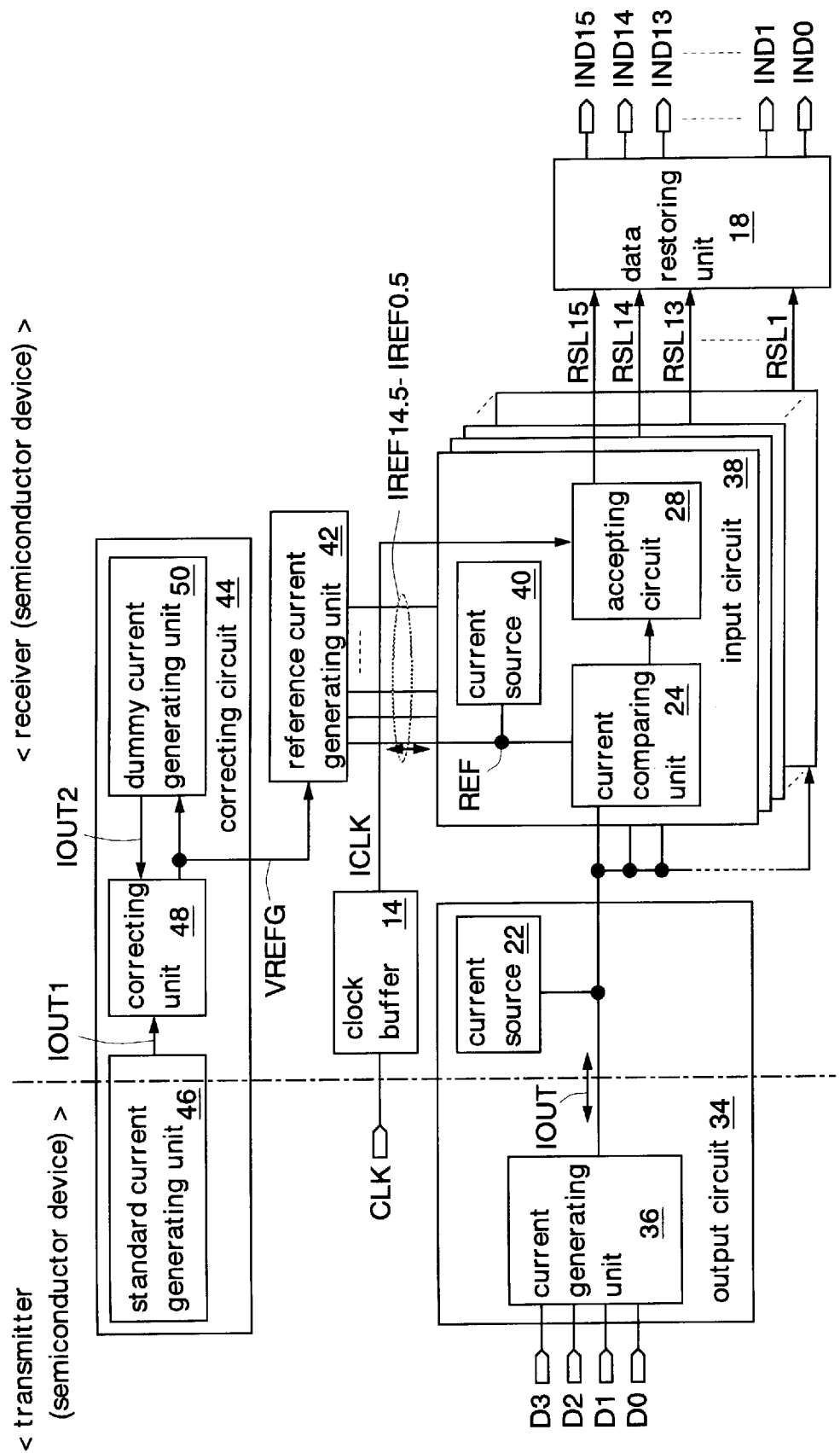
FIG. 9 is a block diagram showing the second embodiment of the invention.

FIG. 9 shows a second embodiment of an input/output interfacing circuit and a semiconductor device having the same input/output interfacing circuit according to the invention. Elements which are identical to those in the first embodiment are given the same reference numbers, and detailed description thereof is omitted.

In the second embodiment, a current generating unit 36 of an output circuit 34 is formed instead of the current generating unit 20 of the output circuit 10 in the first embodiment, a current source 40 of an input circuit 38 is formed instead of the current source 26 of the input circuit 12 in the first embodiment, and a reference current generating unit 42 is formed instead of the reference current generating unit 16 of the first embodiment. Further, a correcting circuit 44 is newly formed, which controls the reference current generating unit 42. That is, the current generating unit 36 of the output circuit 34 and a part of the standard current generating unit 46 of the correcting circuit 44 are formed in a semiconductor device (transmitting device) of the transmitter, and the current source 22 of the output circuit 34, another part of the standard current generating unit 46 of the correcting circuit 44, a correcting unit 48, a dummy current generating unit 50, fifteen input circuits 38, a clock buffer 14, a reference current generating unit 42, and a data restoring unit 19 are formed in the semiconductor device (receiving device) of the receiver. The respective semiconductor devices are formed on a silicon substrate by using the CMOS process.

Figure 10:
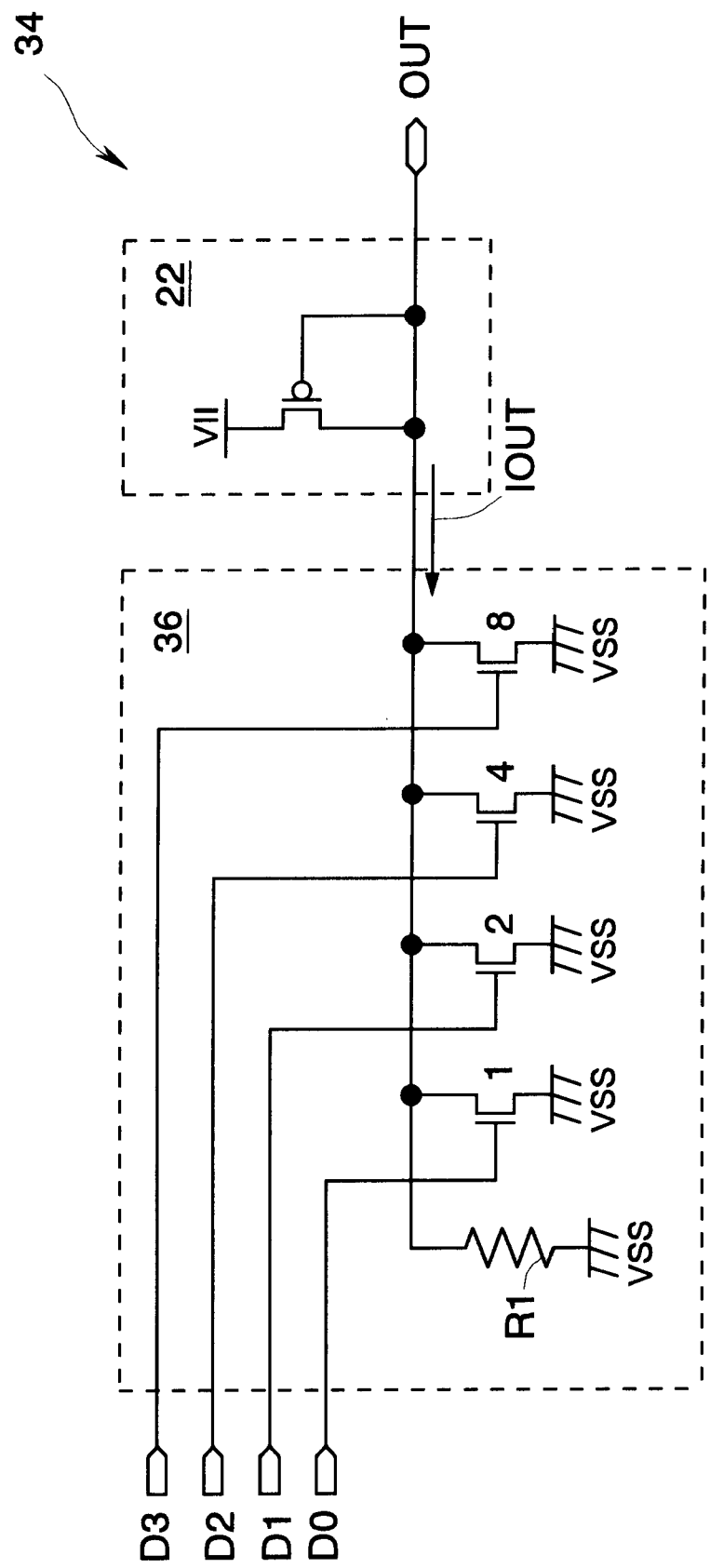
FIG. 10 is a circuit diagram showing the detail of the output circuit of FIG. 9.

FIG. 10 shows the detail of the output circuit 34.

In the output circuit 34, a high-resistance resistor R1 is formed instead of nMOS 20e of the current generating unit 20 of the first embodiment. The other construction thereof is identical to that of the first embodiment.

Figure 11:
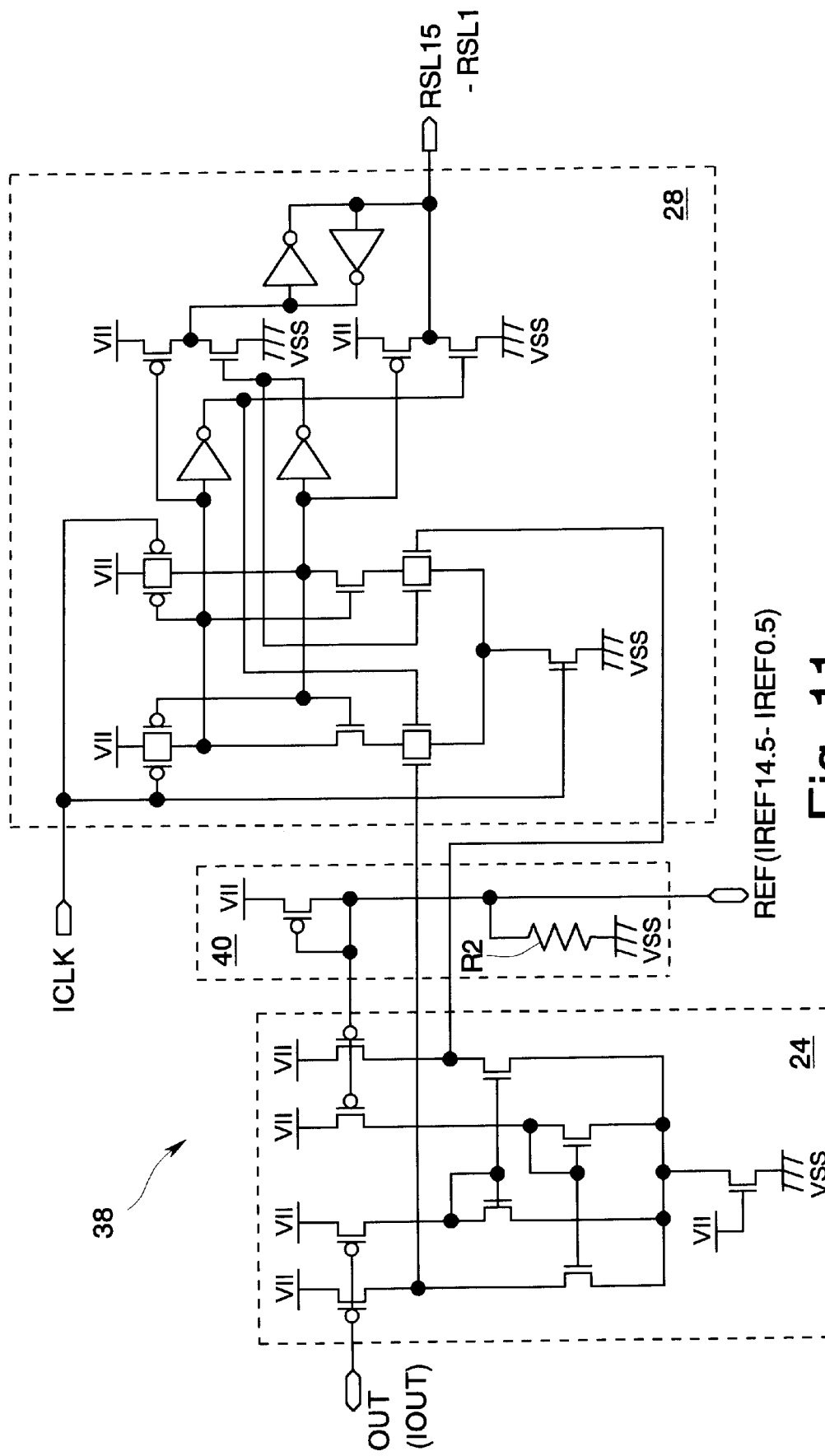
FIG. 11 is a circuit diagram showing the detail of the input circuit of FIG. 9.

FIG. 11 shows the detail of the input circuit 38.

The current source 40 of the input circuit 38 is formed in the current source 26 of the first embodiment by adding a high-resistance resistor R2, one end of which is connected to the ground line VSS. The other construction thereof is identical to that of the input circuit 38 of the first embodiment.

Figure 12:
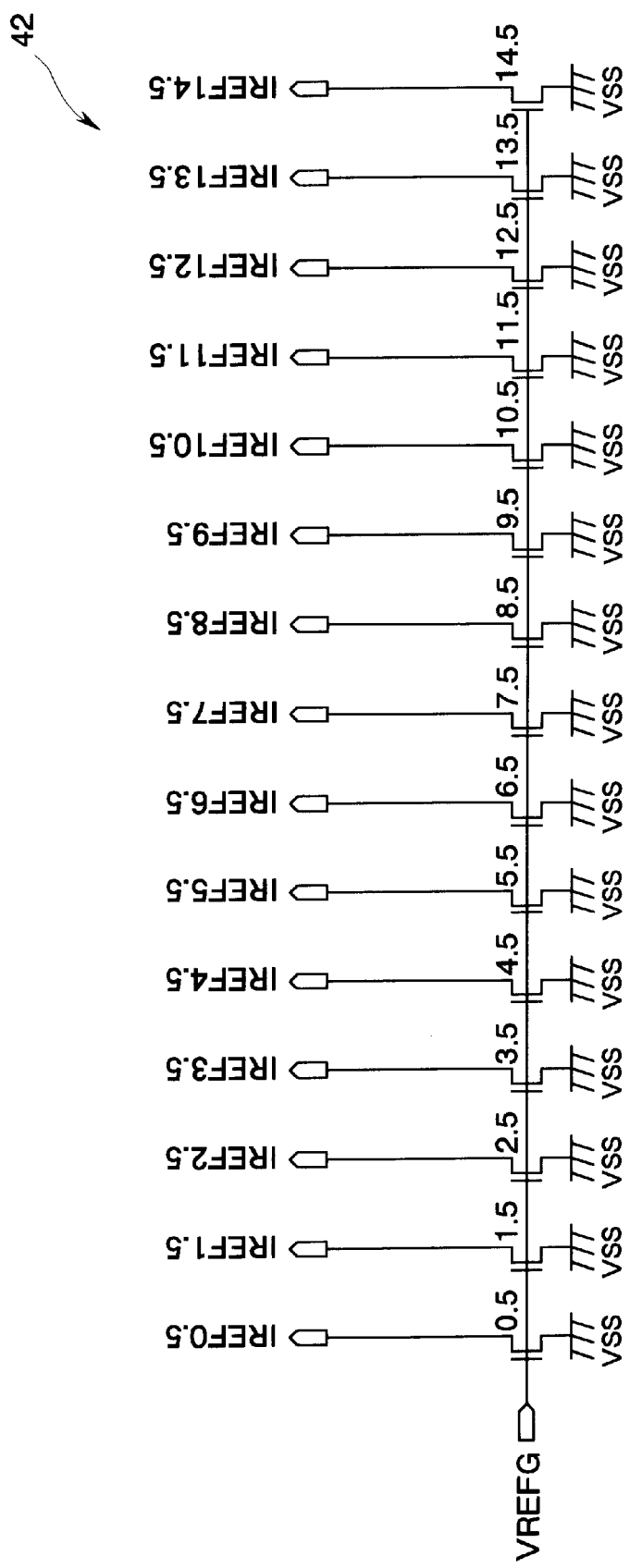
FIG. 12 is a circuit diagram showing the detail of the reference current generating unit of FIG. 9.

FIG. 12 shows the detail of the reference current generating unit 42.

The reference current generating unit 42 is formed by connecting the output node VREFG of the correcting unit 48 to the nMOS gate of the reference current generating unit 16 of the first embodiment. The other construction thereof is identical to that of the reference current generating unit 16 of the first embodiment.

Figure 13:
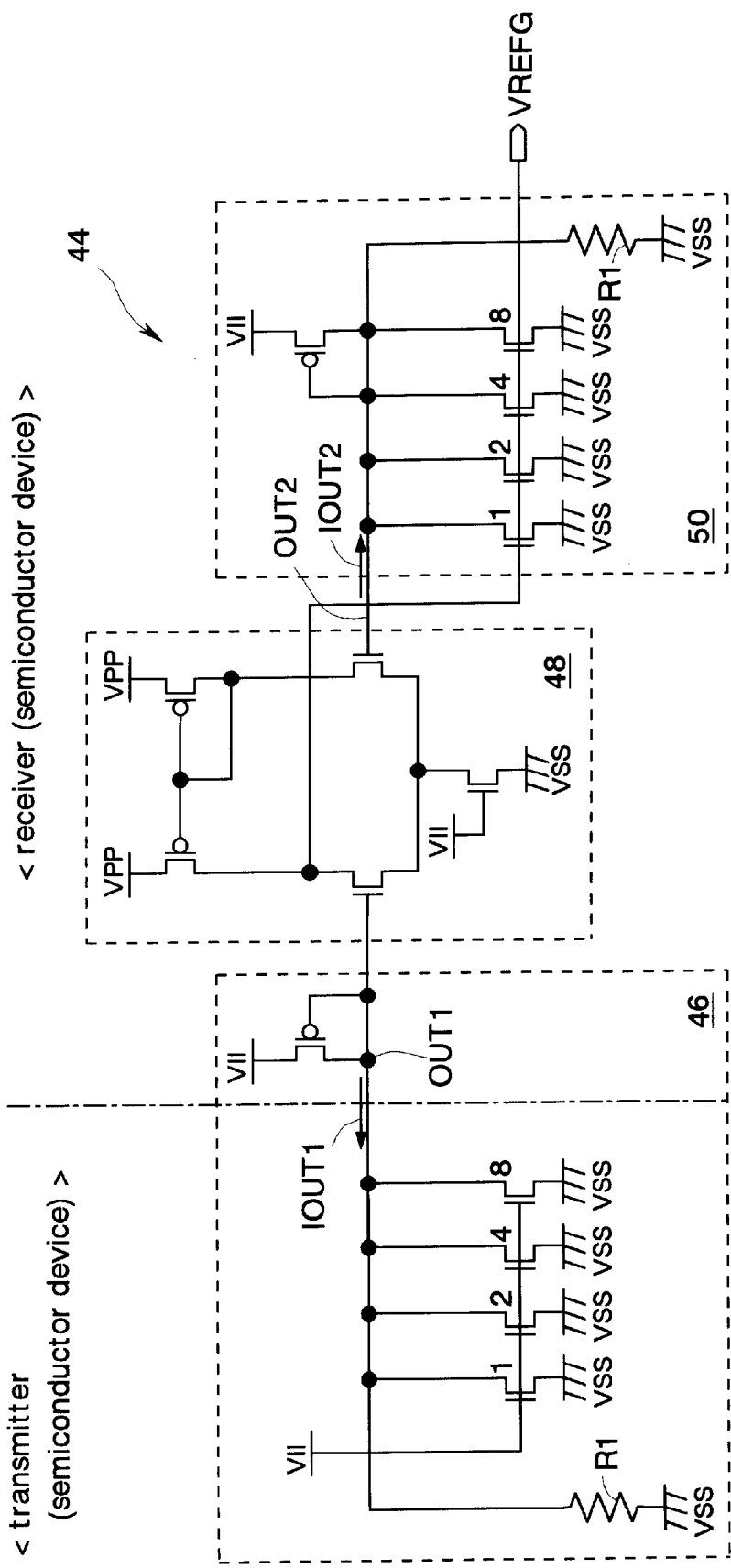
FIG. 13 is a circuit diagram showing the detail of the correcting circuit of FIG. 9.

FIG. 13 shows the detail of the correcting circuit 44.

The standard current generating unit 46 of the correcting circuit 44 includes an nMOS and high-resistance resistor R1, which are identical to those of the current generating unit 36 of the output circuit 34, and a pMOS that is identical to that of the current source 22 of the output circuit 34. The respective nMOS gates are connected to the power supply line VII. That is, the standard current generating unit 46 is a dummy circuit that simulates the operations of the output circuit 34 when the logic value of the output data is "15". An output current IOUT1 (standard current at the output) corresponding to the logic value "15" is generated in the output node OUT1 of the standard current generating unit 46. The standard current generating unit 46 may be constructed equivalently to the current generating unit 36 and the current source 22.

The correcting unit 48 of the correcting circuit 44 includes a current mirror part composed of pMOSs and a differential input part composed of nMOSs. The output node OUT1 is connected to one nMOS gate of the differential input part while the output node OUT2 of the dummy current generating unit 50 is connected to the other nMOS gate. A boost voltage VPP, which is higher than the power supply voltage VII, is supplied to the pMOSs source. Therefore, even if a voltage, which is higher than the power supply voltage VII, is inputted into the nMOSs gate, the correcting unit 48 can correctly operate. That is, the standard current generating unit 46 can be made equivalent to the dummy current generating unit 50.

The dummy current generating unit 50 of the correcting circuit 44 includes nMOSs and high-resistance resistor R1, which are identical to those of the current generating unit 36 of the output circuit 34, and a pMOS that is identical to that of the current source 22 of the output circuit 34. The respective nMOS gates are connected to the output node VREFG of the correcting unit 48. The dummy current generating unit 50 may be constructed equivalently to the current generating unit 36 and the current source 22.

The above-described correcting circuit 44 can effectively operate where the characteristics of transistors, etc. differ from each other due to a difference in production conditions between the semiconductor device of the transmitter and that of the receiver, where the power supply voltages differ from each other in the devices, or where the operating temperatures differ from each other in the devices.

For example, when drivability of the transistor of the semiconductor device in the transmitter is large, the output current IOUT that is generated in the current generating unit 36 shown in FIG. 9 is larger than the current flowing in the nMOS produced under standard producing conditions (typical condition). Therefore, the relative values (FIGS. 1 through 8) of the drivability of the nMOSs of the output circuit 34 shown in FIG. 10 may change, respectively, compared with the relative Values (FIGS. 14.5 through 0.5) of the drivability of the nMOSs in the reference current generating unit 42 shown in FIG. 12. As the result, there is a possibility that the comparison in the current comparing units 24 is not correctly carried out.

Since the size of the nMOSs of the standard current generating unit 46 of the correcting circuit 44 is the same as that of the nMOSs of the current generating unit 36, the drivability of the standard current generating unit 46 is increased along with the drivability of the current generating unit 36. Therefore, the drivability of the nMOSs of the standard current generating unit 46 in the correcting circuit 44 becomes larger than the drivability of the nMOSs of the dummy current generating unit 50, wherein the output current IOUT1 becomes larger than an output current IOUT2 (standard current at the input).

The correcting unit 48 receives a voltage of the node OUT1, which is lower than the voltage of the node OUT2, and raises the voltage of the output node VREFG. The output node VREFG continues to be raised until the output current IOUT2 of the dummy current generating unit 50 is increased to be equal to the voltage of the nodes OUT1 and OUT2.

The drivability of the respective nMOSs in the reference current generating unit 42 becomes large due to the rise of the voltage of the output node VREFG. That is, the current supply capacity of the reference current generating unit 42 is corrected. As a result, the current supply capacity of the current generating unit 36 of the transmitter is made equal to the current supply capacity of the reference current generating unit 42 of the receiver regardless of differences in production conditions, wherein correct comparisons can be carried out in the current comparing units 24.

The embodiment can bring about effects that are similar to those of the above-described first embodiment. In addition, since, in the embodiment, the reference currents IREF14.5 through IREF0.5 that the reference current generating unit 42 of the receiver generates are corrected by the correcting circuit 44 in accordance with the current supply capacity of the current generating unit 36 of the transmitter. Therefore, multiple value data transmitted from the transmitter can be correctly restored by the receiver, regardless of differences in production conditions, the power supply voltage and/or, the operating temperature in the semiconductor devices of the transmitter and the receiver. In other words, it is possible to construct the input/output interface capable of quickly input/output multiple value data.

In addition, in the above-described embodiment, a description was given of the example in which the output data D3 through D0 are transmitted to the receiver. The invention is not limited to such an embodiment. For example, addresses, commands or control signals may be transmitted to the receiver as multiple value data. Also, the multiple value data may not be always of 4 bits, but may be of two bits or eight bits.

In the above-described embodiment, a description was given of the example in which a transmitter and a receiver are formed in separate semiconductor devices. The invention is not limited to such an embodiment. For example, the transmitter and receiver may be formed in a single semiconductor device. Where the transmitter and receiver are formed in a single semiconductor device, the number of signal line patterns can be reduced, in which a logic value is transmitted. Since the layout area of the signal line patterns is reduced, the chip size can be reduced.

In the above-described embodiment, a description was given of the example in which multiple value data transmitted from a transmitter are compared with a plurality of reference data by the receiver. The invention is not limited to such an embodiment. For example, the amount of information (not necessarily multiple value) transmitted from the transmitter may be only compared by the receiver. At this time, a correcting circuit that is equivalent to the above-described correcting circuit 44 is formed, wherein the reference current may be corrected in accordance with the current supply capacity of the current generating unit of the transmitter.

The invention is not limited to the above embodiments and various modifications may be made without departing from the spirit and the scope of the invention. Any improvement may be made in part or all of the components.

What is claimed is:

1. An input/output interfacing circuit comprising:
   a current generating unit in a transmitter for generating output current respectively corresponding to a plurality of logic values;
   a reference current generating unit in a receiver for generating a plurality of reference currents;
   a plurality of current comparing units in said receiver for respectively comparing said reference currents with said output current; and
   a data restoring unit for restoring said logic values in said receiver according to comparison results from said current comparing units.

2. The input/output interfacing circuit according to claim 1, wherein:
   the number of said current comparing units and the number of said reference currents that are generated by said reference current generating unit are one smaller than the number of said logic values; and
   values of said reference currents are respectively set between values of said output currents adjacent to each other.

3. The input/output interfacing circuit according to claim 1, comprising:
   said transmitter and said receiver respectively formed in separate devices;
   a standard current generating unit in said transmitter for generating standard current at the output by using an element identical to an element that is used in said current generating unit;
   a dummy current generating unit constructed identically to said standard current generating unit, in said receiver, for generating standard current at the input; and
   a correcting unit in said receiver for controlling said reference current generating unit to correct values of said reference currents according to a difference between said standard current at the output and said standard current at the input.

4. The input/output interfacing circuit according to claim 1, comprising:
   said transmitter and said receiver respectively formed in separate devices;
   a standard current generating unit in said transmitter for generating standard current at the output by using an element equivalent to an element that is used in said current generating unit; and
   a dummy current generating unit constructed equivalently to said standard current generating unit, in said receiver, for generating said standard current at the input; and
   a correcting unit in said receiver for controlling said reference current generating unit to correct values of said reference currents according to a difference between said standard current at the output and said reference standard at the input.

5. The input/output interfacing circuit according to claim 1, comprising:
   said transmitter and said receiver respectively formed in separate devices;
   a current source in said receiver for supplying a current to said current generating unit and a current source in said receiver for supplying a current to said reference current generating unit.

6. The input/output interfacing circuit according to claim 1, wherein said current generating unit:
   comprises a plurality of transistors with drivability in different stages of strength, for respectively receiving each bit of said logic values, which are expressed in binary number, at inputs of said transistors; and
   generates said output current according to values of currents which flow in said transistors that are turned on in accordance with a level of said each bit.

7. The input/output interfacing circuit according to claim 1, wherein said current comparing units compare said reference currents with said output current in synchronization with a timing signal used in said transmitter, respectively.

8. An input/output interface comprising:
   a current generating unit in a transmitting device for generating output current in correspondence with each of logic values;
   a standard current generating unit in said transmitting device for generating reference current at the output by using an element identical to an element used in said current generating unit;
   a reference current generating unit in a receiving device for generating reference current;
   a current comparing unit in said receiving device for comparing said reference current with said output current;
   a dummy current generating unit constructed identically to said standard current generating unit, in said receiving device, for generating standard current at the input; and
   a correcting unit in said receiving device for controlling said reference current generating unit to correct values of said reference currents according to a difference between said standard current at the output and said standard current at the input.

9. An input/output interface comprising:
   a current generating unit in a transmitting device for generating output current in correspondence with each of logic values;

a standard current generating unit in said transmitting device for generating reference current at the output by using an element equivalent to an element used in said current generating unit;

a reference current generating unit in a receiving device for generating reference current;

a current comparing unit in said receiving device for comparing said reference current with said output current;

a dummy current generating unit constructed equivalently to said standard current generating unit, in said receiving device, for generating standard current at the input; and a correcting unit in said receiving device for controlling said reference current generating unit to correct values of said reference currents according to a difference between said standard current at the output and said standard current at the input.

10. A semiconductor device comprising an input/output interfacing circuit including:

a reference current generating unit for generating a plurality of reference currents;

a plurality of current comparing units for respectively comparing output current in correspondence with each of logic values supplied from an exterior, with said reference currents; and a data restoring unit for restoring said logic values according to comparison results from said current comparing units.

11. A semiconductor device comprising an input/output interfacing circuit, wherein a current generating unit:

comprises a plurality of transistors with drivability in different stages of strength, for respectively receiving each bit of logic values, which are expressed in binary number, at inputs of said transistors; and generates output current according to values of currents which flow in said transistors that are turned on in accordance with a level of said each bit.

* * * * *